(12) United States Patent
Fukuda

(10) Patent No.: US 6,804,155 B2
(45) Date of Patent: Oct. 12, 2004

(54) SEMICONDUCTOR STORAGE DEVICE

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 10/319,591

(22) Filed: Dec. 16, 2002

(65) Prior Publication Data

US 2004/0057308 A1 Mar. 25, 2004

(30) Foreign Application Priority Data

Sep. 25, 2002 (JP) ........................................ 2002-279741

(51) Int. Cl.$^7$ .................................................. G11C 7/00
(52) U.S. Cl. .................... 365/200; 365/201; 365/189.02
(58) Field of Search ................................ 365/200, 201, 365/189.02

(56) References Cited

U.S. PATENT DOCUMENTS 6,269,033 B1 * 7/2001 Ishida et al. ................. 365/200
6,459,630 B2 * 10/2002 Nakayama et al. .......... 365/200
6,584,022 B2 * 6/2003 Tsuji ............................ 365/200

OTHER PUBLICATIONS

Toshimasa Namekawa, et al., "Dynamically Shift–Switched Dataline Redundancy Suitable for DRAM Macro with Wide Data Bus", IEEE Journal of Solid–State Circuits, vol. 35, No. 5, May 2000, pp. 705–712.

* cited by examiner

Primary Examiner—Van Thu Nguyen
Assistant Examiner—Toan Le
(74) Attorney, Agent, or Firm—Oblon, Spivak, McClelland, Maier & Neustadt, P.C.

(57) ABSTRACT

A semiconductor storage device includes an array region, which includes memory cell array blocks and is connected to a (k: k is a natural number)-number of data input/output lines. A (k+m: m is a natural number)-number of common internal data lines are provided in common to the memory cell array blocks. A (k+m+n: n is a natural number)-number of individual internal data lines are provided to each memory cell array block. An individual line connection circuit is configured to respectively connect a (k+m)-number of the (k+m+n)-number of individual internal data lines to the (k+m)-number of common internal data lines, in accordance with a first defect information signal. A common line connection circuit is configured to respectively connect a k-number of the (k+m)-number of common internal data lines to the k-number of data input/output lines, in accordance with a second defect information signal.

19 Claims, 6 Drawing Sheets

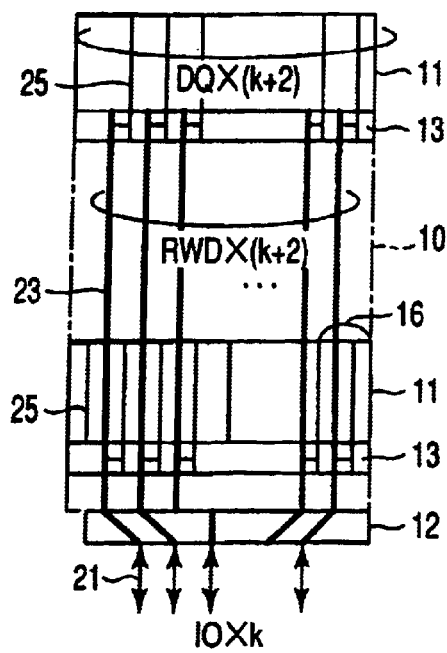
F I G. 14

SEMICONDUCTOR STORAGE DEVICE

CROSS REFERENCE TO RELATED APPLICATIONS

This application is based upon and claims the benefit of priority from the prior Japanese Patent Application No. 2002-279741, filed on Sep. 25, 2002, the entire contents of which are incorporated herein by reference.

BACKGROUND OF THE INVENTION

1. Field of the Invention

The present invention relates to a semiconductor storage device, and particularly to a semiconductor storage device having an improved redundancy structure for compensating for a defective data line.

2. Description of the Related Art

In recent years, highly integrated semiconductor storage devices employ a redundancy technique of replacing a defective cell with a redundancy cell, in general. Particularly, hybrid DRAMs (Dynamic Random Access Memory) employ a technique of dynamically switching connection of data lines relative to data input/output lines (Namekawa T. et al., "Dynamically shift-switched data line redundancy suitable for DRAM macro with wide data bus", 1999 Symposium on VLSI Circuits, Digest of Papers, PP. 149–152).

FIG. 13 is a view schematically showing a hybrid DRAM disclosed in the publication described above. As shown in FIG. 13, the array region 10 of the DRAM includes a plurality of memory cell array blocks 11, in each of which a plurality of memory cells are arrayed. Each of the memory cell array blocks 11 is combined with a shift switch block 12 and connection block 13 to form a block unit 15.

A (k: k is a natural number)-number of data input/output lines (IO lines) 21 are connected to the array region 10. In the array region 10, a k-number of common internal data lines (RWD lines) 23 are disposed in common to the plurality of memory cell array blocks 11. The RWD lines 23 are respectively formed integrally with the IO lines 21.

On the other hand, in each of the plurality of memory cell array blocks 11, a (k+2)-number of individual internal data lines (DQ lines) 25 are disposed. Of them, a k-number of DQ lines 25 are connected to the k-number of RWD lines 23 through the shift switch block 12 and connection block 13.

When data in the memory cells is read, the data is transmitted from the DQ lines 25 through the shift switch block 12 and connection block 13 to the RWD lines 23, and then is outputted to the IO lines 21.

This hierarchical structure of data lines is adopted for the following reasons. (1) With an increase in operation frequency required to hybrid DRAMs, it has become necessary to operate in smaller blocks. (2) Since multi-layered interconnection lines have become usable, it is easy to arrange hierarchical structures. (3) Since redundancy can be accomplished in every block unit, it is possible to increase the yield with the same number of spare array portions (an increase in remedy efficiency).

In the DRAM shown in FIG. 13, one of the many block units 15 is selected in operation. The DQ lines 25 in each of the block units 15 have redundancy, and are selectively connected to the RWD lines 23 disposed outside the block unit 15. The selective connection for administering the redundancy function is performed by the connection block 13 and shift switch block 12. The shift switch block 12 connects the RWD lines 23 and DQ lines 25 to each other, while avoiding defective DQ lines 25, on the basis of defect information stored in an internal ROM.

The necessary number of IO lines 21 is K, and the number of RWD lines 23 disposed is also K. The DQ lines 25 include two redundancy DQ lines relative to the IO lines 21 and RWD lines 23, and thus the number of them is k+2.

The shift switch block 12 is designed to connect the RWD lines 23 respectively to the corresponding left side DQ lines 25 in the memory cell array block 11, when the redundancy function is not used (see the lowermost block unit 15 in FIG. 13). Accordingly, in the memory cell array block 11, portions corresponding to two DQ lines on the right side are used as spare portions for redundancy, as indicated with a reference symbol 16.

BRIEF SUMMARY OF THE INVENTION

According to a first aspect of the present invention, there is provided a semiconductor storage device comprising:

an array region including a plurality of memory cell array blocks, in each of which a plurality of memory cells are arrayed, the array region being connected to a (k: k is a natural number)-number of data input/output lines;

a (k+m: m is a natural number)-number of common internal data lines provided in common to the plurality of memory cell array blocks;

a (k+m+n: n is a natural number)-number of individual internal data lines provided to each of the plurality of memory cell array blocks;

an individual line connection circuit for data line redundancy configured to respectively connect a (k+m)-number of the (k+m+n)-number of individual internal data lines to the (k+m)-number of common internal data lines, in accordance with a first defect information signal; and a common line connection circuit for data line redundancy configured to respectively connect a k-number of the (k+m)-number of common internal data lines to the k-number of data input/output lines, in accordance with a second defect information signal.

According to a second aspect of the present invention, there is provided a semiconductor storage device comprising:

an array region including a plurality of memory cell array blocks, in each of which a plurality of memory cells are arrayed, the array region being connected to a (k: k is a natural number)-number of data input/output lines;

a (k+m: m is a natural number)-number of common internal data lines provided in common to the plurality of memory cell array blocks;

a (k+m)-number of individual internal data lines provided to each of the plurality of memory cell array blocks;

an individual line connection circuit for data line redundancy configured to respectively connect a (k to k+m)-number of the (k+m)-number of individual internal data lines to a (k to k+m)-number of the (k+m)-number of common internal data lines, in accordance with a first defect information signal; and a common line connection circuit for data line redundancy configured to respectively connect a k-number of the (k to k+m)-number of common internal data lines to the k-number of data input/output lines, in accordance with a second defect information signal.

According to a third aspect of the present invention, there is provided a semiconductor storage device comprising:

an array region including a plurality of memory cell array blocks, in each of which a plurality of memory cells are arrayed, the array region being connected to a (k: k is a natural number)-number of data input/output lines;

a (k+m: m is a natural number)-number of common internal data lines provided in common to the plurality of memory cell array blocks;

a (k+n: n is a natural number)-number of individual internal data lines provided to each of the plurality of memory cell array blocks;

a k-number of intermediate connection lines provided between the common internal data lines and the individual internal data lines, to each of the plurality of memory cell array blocks;

an individual line connection circuit for data line redundancy configured to respectively connect a k-number of the (k+n)-number of individual internal data lines to the k-number of intermediate connection lines, in accordance with a first defect information signal;

a first common line connection circuit for data line redundancy configured to respectively connect a k-number of the (k+m)-number of common internal data lines to the k-number of data input/output lines, in accordance with a second defect information signal; and a second common line connection circuit for data line redundancy configured to respectively connect the k-number of common internal data lines to the k-number of intermediate connection lines, in accordance with the second defect information signal.

According to a fourth aspect of the present invention, there is provided a semiconductor storage device according to the third aspect, and further comprising a test signal generation circuit configured to generate a test signal for testing the common internal data lines, and a test determination circuit configured to determine whether the common internal data lines are good or bad, wherein the test signal generation circuit and the test determination circuit are respectively connected to opposite ends of the common internal data lines, and the test determination circuit includes a circuit portion configured to hold a test determination result and generate the second defect information signal based on the result. In this case, the test signal generation circuit and the test determination circuit may be preset to operate when the semiconductor storage device is turned on.

BRIEF DESCRIPTION OF THE SEVERAL VIEWS OF THE DRAWING

FIG. 14 is a view schematically showing a hybrid DRAM according to a comparative example.

DETAILED DESCRIPTION OF THE INVENTION

In the process of developing the present invention, the inventors studied problems occurring in redundancy structures of DRAMs, such as the DRAM described with reference to FIG. 13. As a result, the present inventors have arrived at the findings given below.

Figure 13:
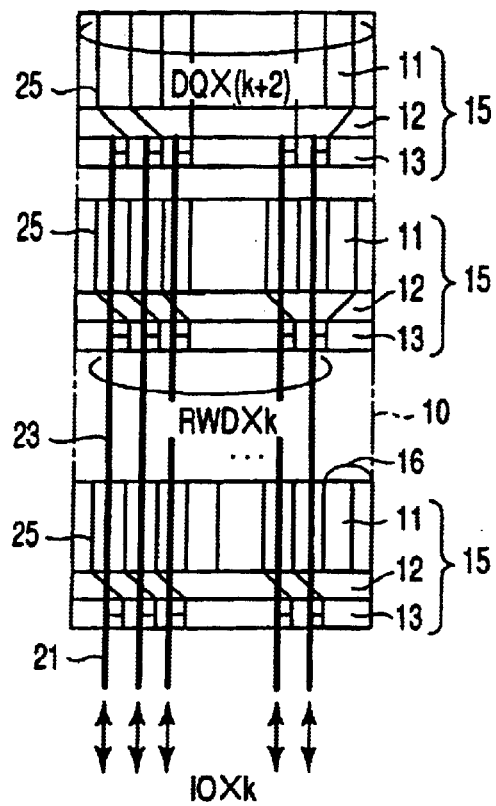
FIG. 13 is a view schematically showing a conventional hybrid DRAM.

The publication Namekawa T. et al. described above adopts a method of dynamically changing connection for every address to be accessed, in order to increase the remedy efficiency in the structure shown in FIG. 13. In this method, however, since the access speed in writing is determined by the shift speed, it is difficult to attain a high speed operation.

On the other hand, the structure shown in FIG. 13 may be operated such that the shift is not dynamically performed, but statically performed for every block unit 15. With this operation, redundancy can be determined for every shift switch block 12, thereby increasing the remedy efficiency, as in the dynamic operation. However, in this case, the following problem arises. Specifically, when a defect of the open-short type occurs in the RWD lines 23, it cannot be remedied (because there is no redundancy prepared for the RWD lines).

In order to avoid this problem, the shift switch block 12 could be moved to a position between the RWD lines 23 and 10 lines 21, as in the structure shown in FIG. 14. In this case, dynamic shift restricts the speed, and static shift reduce the remedy efficiency. Accordingly, the structure shown in FIG. 14 requires more spare cell blocks than there are in the structure shown in FIG. 13, to obtain the same yield.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

(First Embodiment)

Figure 1:
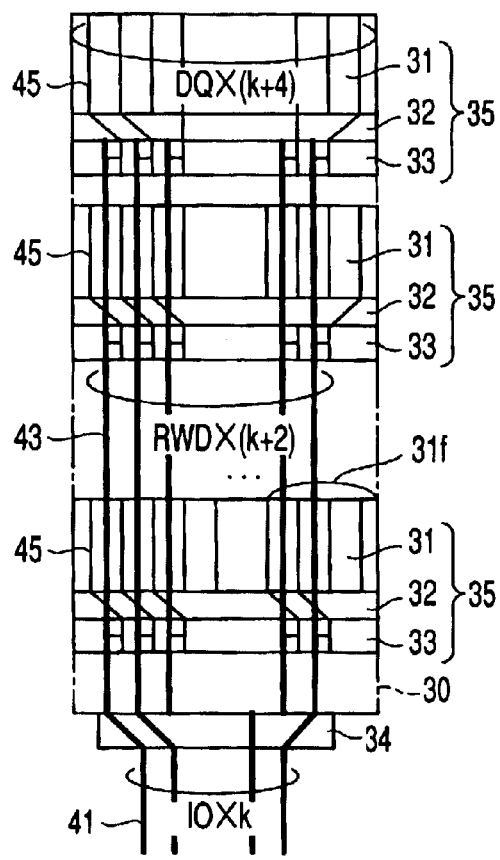
FIG. 1 is a view schematically showing a hybrid DRAM according to a first embodiment of the present invention.

FIG. 1 is a view schematically showing a hybrid DRAM according to a first embodiment of the present invention. As shown in FIG. 1, the array region 30 of the DRAM includes a plurality of memory cell array blocks 31, in each of which a plurality of memory cells are arrayed. Each of the memory cell array blocks 31 is combined with a shift switch block (individual line connection circuit) 32 and connection block 33 to form a block unit 35.

A (k: k is a natural number)-number of data input/output lines (10 lines) 41 are connected to the array region 30. In the array region 30, a (k+2 or k+m: m=2)-number of common internal data lines (RWD lines) 43 are disposed in common to the plurality of memory cell array blocks 31. Of them, a k-number of RWD lines 43 are connected to the k-number of IO lines 41 through a shift switch block (common line connection circuit) 34 disposed in common to the plurality of memory cell array blocks 31.

On the other hand, in each of the plurality of memory cell array blocks 31, a (k+4 or k+m+n: n=2)-number of individual internal data lines (DQ lines) 45 are disposed. Of them, a (k+m)-number of DQ lines 45 are connected to the (k+m)-number of RWD lines 43 through the shift switch block 32 and connection block 33.

When data in the memory cells is read, the data is transmitted from the DQ lines 45 through the shift switch block 32 and connection block 33 to the RWD lines 43, and then is outputted to the IO lines 41 through the shift switch block 34.

In the DRAM shown in FIG. 1, one of the many block units 35 is selected in operation. The DQ lines 45 in each of the block units 35 have redundancy, and are selectively connected to the RWD lines 43 disposed outside the block unit 35. The selective connection for administering the redundancy function is performed by the connection block 33 and shift switch block 32. The shift switch block 32 connects the RWD lines 43 and DQ lines 45 to each other, while avoiding defective DQ lines 45, on the basis of defect information stored in an internal ROM.

The RWD lines 43 in the array region 30 also have redundancy, and are selectively connected to the IO lines 41 disposed outside the array region 30. The selective connection for administering the redundancy function is performed by the shift switch block 34. The shift switch block 34 connects the IO lines 41 and RWD lines 43 to each other, while avoiding defective RWD lines 43, on the basis of defect information stored in an internal ROM.

The necessary number of IO lines 41 is K. The RWD lines 43 include two redundancy RWD lines relative to the 10 lines 41, and thus the number of them is k+2. The DQ lines 45 include two redundancy DQ lines relative to the RWD lines 43, and thus the number of them is k+4.

The shift switch block 32 is designed to connect the RWD lines 43 respectively to the corresponding left side DQ lines 45 in the memory cell array block 31, when the redundancy function is not used. Similarly, the shift switch block 34 is designed to connect the IO lines 41 respectively to the corresponding left side RWD lines 43 in the array region 30, when the redundancy function is not used. Accordingly, in the memory cell array block 31, portions corresponding to four DQ lines on the right side are used as spare portions for redundancy, as indicated with a reference symbol 31f.

Figure 3:
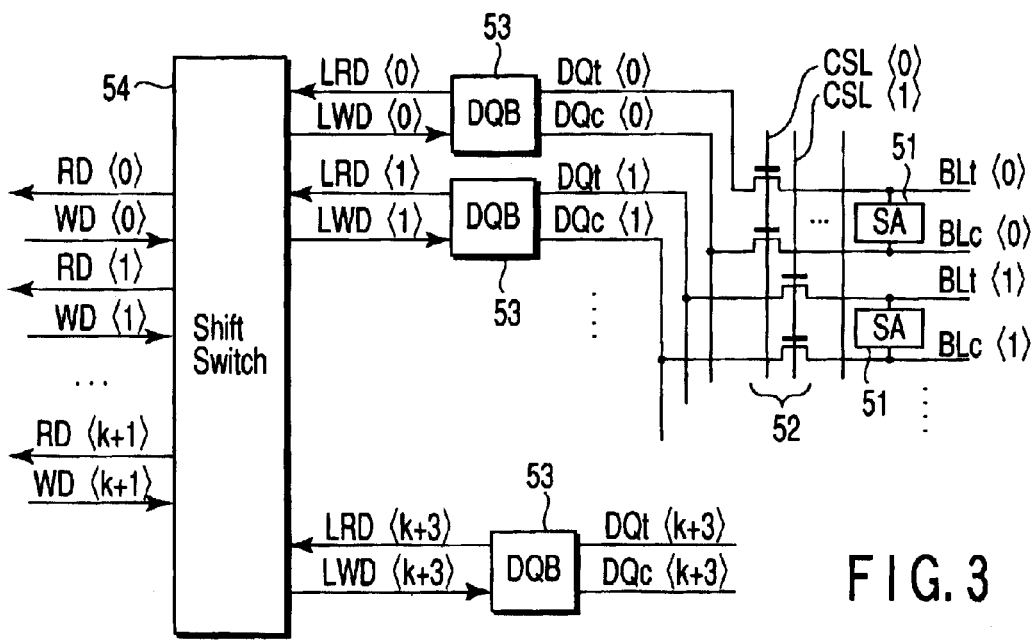
FIG. 3 is a circuit diagram showing the relationship in detail between RWD lines, DQ lines, and memory cell array block in the DRAM shown in FIG. 1.

FIG. 3 is a circuit diagram showing the relationship in detail between the RWD lines 43, DQ lines 45, and memory cell array block 31 in the DRAM shown in FIG. 1. Complementary bit line pairs BLt<n> and BLc<n> are connected to the memory cells of the memory cell array block 31. Each bit line pair BLt<n> and BLc<n> is connected to a sense amplifier 51.

When data in a memory cell is read, the corresponding word line (not shown) is selected, and a signal from the selected memory cell is outputted to one line of the corresponding bit line pair BLt<n> and BLc<n>. To the other line of the bit line pair, a reference signal from a non-selected memory cell is outputted. The two signals are compared with each other and amplified by the sense amplifier 51, so that the value of the data in the selected memory cell is determined.

The bit line pairs BLt<n> and BLc<n> are respectively connected to complementary (true-complementary) DQ line pairs DQt<m> and DQc<m> through column selection gates 52. The DQ line pairs DQt<m> and DQc<m> correspond to the DQ lines 45 shown in FIG. 1. In FIG. 1, however, each of the DQ line pairs (two interconnection lines) is shown with one line 45.

Each of the column selection gates 52 is formed of an NMOS transistor. The gate electrode of the transistor forming one column selection gate 52 is supplied with a selection signal CSL<j>. The bit line pairs and DQ line pairs are operated in reading and in writing.

The respective DQ line pairs DQt<m> and DQc<m> are connected to DQ buffers 53. Each of the DQ buffers 53 has a data input line LWD<m> from the outside, and a data output line LRD<m> to the outside. In reading, data from the DQ line pair DQt<m> and DQc<m> is transmitted to the data output line LRD<m>. In writing, data from the data input line LWD<m> is transmitted to the DQ line pair DQt<m> and DQc<m>.

The data input lines LWD<m> and data output lines LRD<m> are connected to RWD lines RD<j> and RWD lines WD<j>, respectively, through a shift switch block 54. The shift switch block 54 corresponds to the shift switch block 32 shown in FIG. 1. The RWD lines RD<j> and WD<j> correspond to the RWD lines 43 shown in FIG. 1. In FIG. 1, however, a pair of two signal lines RD and WD are shown with one line 43.

Figure 4:
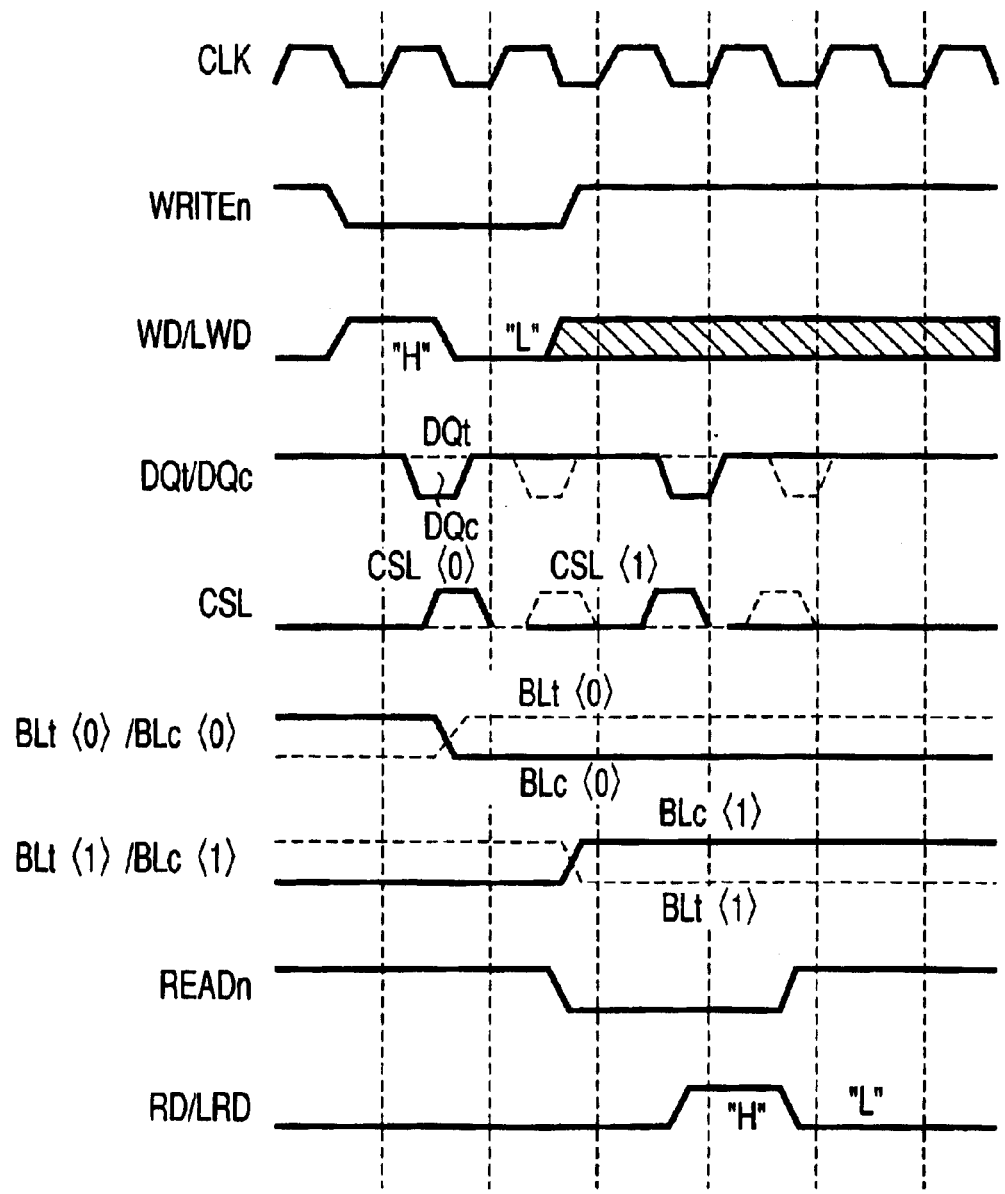
FIG. 4 is a view showing an example of operation waveforms in the circuit shown in FIG. 3.

FIG. 4 is a view showing an example of operation waveforms in the circuit shown in FIG. 3. This example shows the case of writing "1", writing "0", reading "1", and reading "0". As shown in FIG. 4, signals on the WD line/LWD line, and RD line/LRD line are not complementary signals, while the signals on the DQ line pair, and BL line pair are complementary signals.

Figure 2:
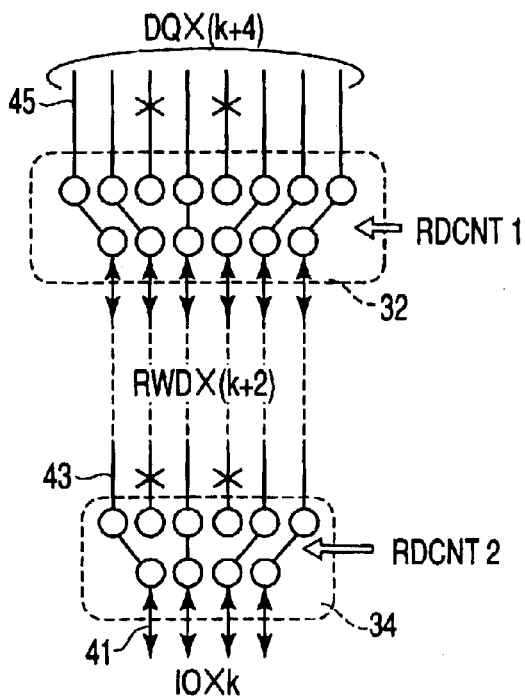
FIG. 2 is a view abstractly showing the relationship between main parts in the DRAM shown in FIG. 1.

FIG. 2 is a view abstractly showing the relationship between the IO lines 41, shift switch block 34, RWD lines 43, shift switch block 32, and DQ lines 45 in the DRAM shown in FIG. 1. FIG. 2 illustrates the case of k=4. Specifically, the number of RWD lines 43 is k+2=6, and the number of DQ lines 45 is k+4=8.

Each switch element in the shift switch blocks 32 and 34 can switch among three terminals on its front, right, and left. The shift states of the shift switch blocks 32 and 34 are determined by signals RDCNT1 and RDCNT2. The signals RDCNT1 and RDCNT2 are respectively based on redundancy information stored in two internal ROMs.

More specifically, the shift switch block 32 operates to select a (k+m or 4+2=6)-number of normal DQ lines 45, excluding defective DQ lines, and connect them to the (k+m)-number of RWD lines 43, in accordance with the signal RDCNT1 from information concerning defects of the DQ lines 45. The shift switch block 34 operates to select a (k or 4)-number of normal RWD lines 43, excluding defective RWD lines, and connect them to the k-number of IO lines 41, in accordance with the signal RDCNT2 from information concerning defects of the RWD lines 43. As a consequence, the IO lines 41 and k-number of normal DQ lines 45 are connected to each other through the k-number of normal RWD lines 43.

According to the DRAM shown in FIG. 1, more spare portions for redundancy are required in each memory cell array block 31, as compared to the DRAM shown in FIG. 13. However, it is possible to remedy all the cases where two defective lines occur in the RWD lines 43 and two defective lines occur in the DQ lines 45.

(Second Embodiment)

Figure 5:
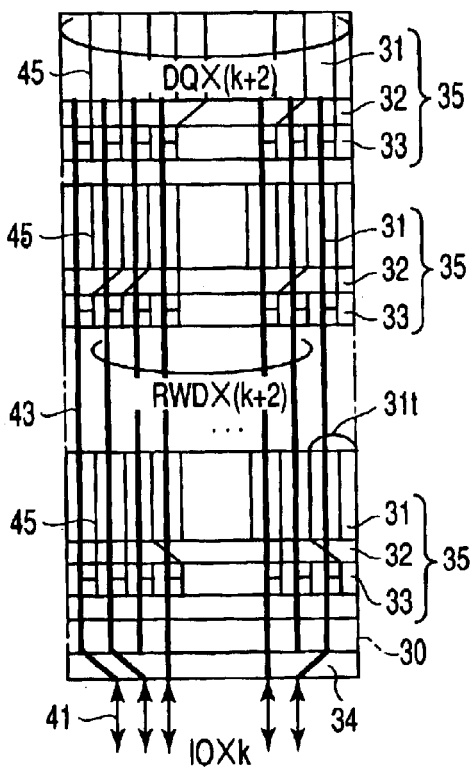
FIG. 5 is a view schematically showing a hybrid DRAM according to a second embodiment of the present invention.

FIG. 5 is a view schematically showing a hybrid DRAM according to a second embodiment of the present invention.

As shown in FIG. 5, a (k: k is a natural number)-number of data input/output lines (IO lines) 41 are connected to the array region 30 of the DRAM. In the array region 30, a (k+2 or k+m: m=2)-number of common internal data lines (RWD lines) 43 are disposed in common to a plurality of memory cell array blocks 31. In each of the plurality of memory cell array blocks 31, a (k+2 or k+m)-number of individual internal data lines (DQ lines) 45 are disposed.

Of the (k+2)-number of the RWD lines 43, a k-number of RWD lines 43 are connected to the k-number of IO lines 41 through a shift switch block (common line connection circuit) 34 disposed in common to the plurality of memory cell array blocks 31. On the other hand, of the (k+2)-number of DQ lines 45, a (k to k+2)number of DQ lines 45 are connected to a (k to k+2)-number of RWD lines 43 through a shift switch block (individual line connection circuit) 32 and connection block 33, which are disposed in each of the plurality of memory cell array blocks 31. In the memory cell array block 31, portions corresponding to two DQ lines on the right side are used as spare portions for redundancy, as indicated with a reference symbol 31t.

Figure 6:
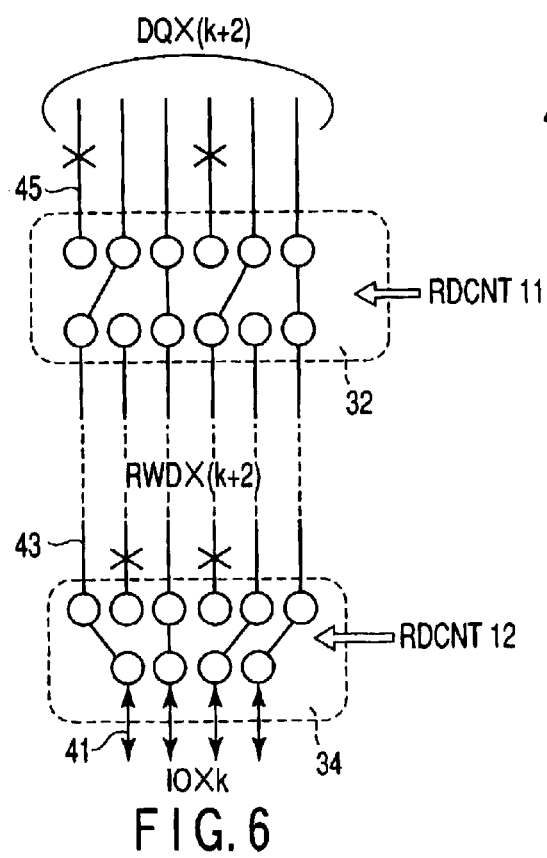
FIG. 6 is a view abstractly showing the relationship between main parts in the DRAM shown in FIG. 5.

FIG. 6 is a view abstractly showing the relationship between the IO lines 41, shift switch block 34, RWD lines 43, shift switch block 32, and DQ lines 45 in the DRAM shown in FIG. 5. FIG. 6 illustrates the case of k=4. Specifically, the number of RWD lines 43 is k+2=6, and the number of DQ lines 45 is k+2=6.

Each switch element in the shift switch blocks 32 and 34 can switch among three terminals on its front, right, and left. The shift states of the shift switch blocks 32 and 34 are determined by signals RDCNT11 and RDCNT12. The signals RDCNT11 and RDCNT12 are respectively based on redundancy information stored in two internal ROMs.

More specifically, the shift switch block 32 operates to select a (k to k+m or 4 to 4+2=6)-number of normal DQ lines 45, excluding defective DQ lines, and connect them to the (k to k+m)-number of RWD lines 43, in accordance with the signal RDCNT11 from information concerning defects of the DQ lines 45. The shift switch block 34 operates to select a (k or 4)-number of normal RWD lines 43, excluding defective RWD lines, from the (k to k+m)-number of RWD lines 43, and connect them to the k-number of IO lines 41, in accordance with the signal RDCNT12 from information concerning defects of the RWD lines 43. As a consequence, the IO lines 41 and k-number of normal DQ lines 45 are connected to each other through the k-number of normal RWD lines 43.

According to the DRAM shown in FIG. 5, the number of spare portions for redundancy in each memory cell array block 31 can be less than that of the DRAM shown in FIG. 1, (specifically the same as that of the DRAM shown in FIG. 13 in this embodiment). As shown in FIG. 6, it is possible to remedy several cases where two defective lines occur in the RWD lines 43 and two defective lines occur in the DQ lines 45.

On the other hand, according to the DRAM shown in FIG. 5, it may be impossible to remedy some cases where two defective lines occur in the RWD lines 43 and two defective lines occur in the DQ lines 45, in relation to the function of each switch element in the shift switch block 32. This problem can be solved by expanding the range of switching of each switch element in the shift switch block 32, beyond terminals on its front, right, and left.

(Third Embodiment)

Figure 7:
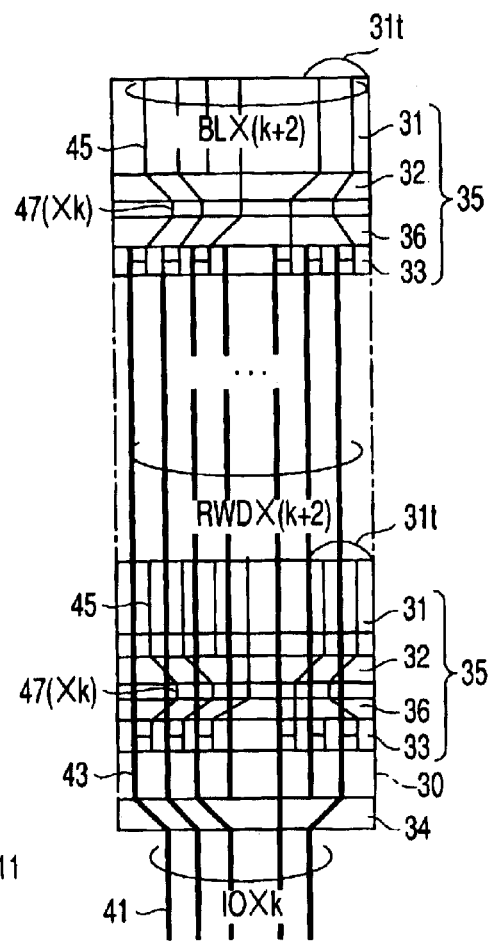
FIG. 7 is a view schematically showing a hybrid DRAM according to a third embodiment of the present invention.

FIG. 7 is a view schematically showing a hybrid DRAM according to a third embodiment of the present invention. As shown in FIG. 7, a (k: k is a natural number)-number of data input/output lines (IO lines) 41 are connected to the array region 30 of the DRAM. In the array region 30, a (k+2 or k+m: m=2)-number of common internal data lines (RWD lines) 43 are disposed in common to a plurality of memory cell array blocks 31. In each of the plurality of memory cell array blocks 31, a (k+2 or k+n: n=2)-number of individual internal data lines (DQ lines) 45 are disposed. Furthermore, in each of the plurality of memory cell array blocks 31, a k-number of individual inner RWD lines (intermediate connection lines) 47 are disposed between the RWD lines 43 and DQ lines 45.

Of the (k+2)-number of the RWD lines 43, a k-number of RWD lines 43 are connected to the k-number of IO lines 41 through a shift switch block (first common line connection circuit) 34 disposed in common to the plurality of memory cell array blocks 31. The k-number of RWD lines 43 are also connected to the k-number of intermediate connection lines 47 through a connection block 33 and shift switch block (second common line connection circuit) 36, which are disposed in each of the plurality of memory cell array blocks 31. On the other hand, of the (k+2)-number of DQ lines 45, a k-number of DQ lines 45 are connected to the k-number of intermediate connection lines 47 through a shift switch block (individual line connection circuit) 32 disposed in each of the plurality of memory cell array blocks 31. In the memory cell array block 31, portions corresponding to two DQ lines on the right side are used as spare portions for redundancy, as indicated with a reference symbol 31t.

Figure 8:
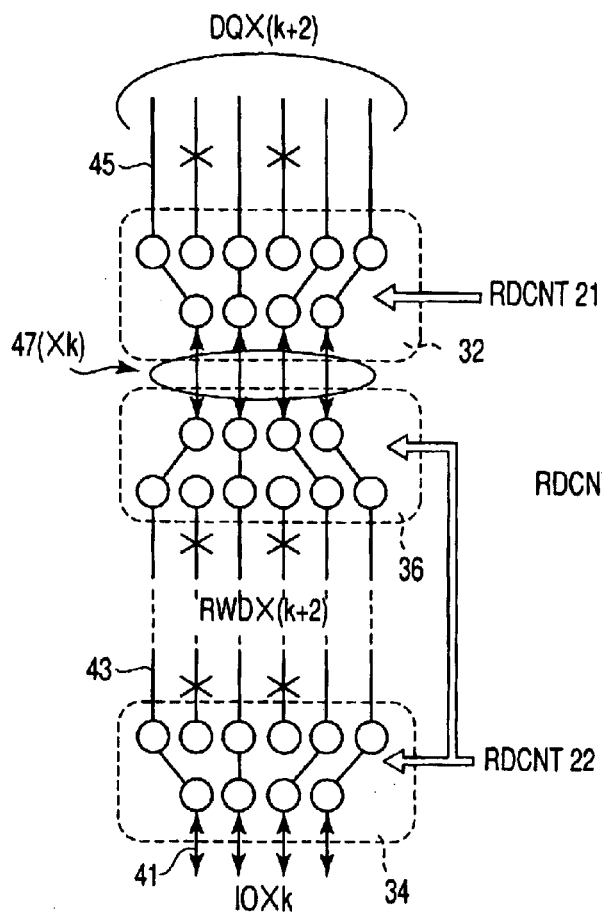
FIG. 8 is a view abstractly showing the relationship between main parts in the DRAM shown in FIG. 7.

FIG. 8 is a view abstractly showing the relationship between the IO lines 41, shift switch block 34, RWD lines 43, shift switch block 36, intermediate connection lines 47, shift switch block 32, and DQ lines 45 in the DRAM shown in FIG. 7. FIG. 8 illustrates the case of k=4. Specifically, the number of RWD lines 43 is k+2=6, the number of intermediate connection lines 47 is k=4, and the number of DQ lines 45 is k+2=6.

The shift switch blocks 34 and 36 are disposed one on either side of functional opposite ends of the (k+2=6)-number of common RWD lines 43, i.e., the connection end to the IO lines 41 and the connection end to each of the array blocks 31. In other words, the shift switch blocks 34 and 36 are disposed in symmetry at the inlet and outlet of the RWD lines 43, respectively.

The shift switch block 36 has the same structure as the shift switch blocks 32 and 34 shown in FIG. 1. Accordingly, each switch element in the shift switch blocks 32, 34 and 36 can switch among three terminals on its front, right, and left. The shift state of the shift switch block 32 is determined by a signal RDCNT21. The shift states of the shift switch blocks 34 and 36 are determined by a signal RDCNT22. The signals RDCNT21 and RDCNT22 are respectively based on redundancy information stored in two internal ROMs.

More specifically, the shift switch block 32 operates to select a (k or 4)-number of normal DQ lines 45, excluding defective DQ lines, and connect them to the intermediate connection lines 47, in accordance with the signal RDCNT21 from information concerning defects in each array block 31. The shift switch blocks 34 and 36 operate to select a (k or 4)-number of normal RWD lines 43, excluding defective RWD lines, and connect them to the IO lines 41 and intermediate connection lines (individual RWD lines) 47, in accordance with the signal RDCNT22 from information concerning defects of the RWD lines 43. As a consequence, the IO lines 41 and k-number of normal DQ lines 45 are connected to each other through the k-number of normal RWD lines 43.

According to the DRAM shown in FIG. 7, the shift switch block 36 and intermediate connection lines (individual RWD lines) 47 have to be further disposed between the common RWD lines 43 and DQ lines 45, as compared to the DRAM shown in FIG. 5. However, it is possible to remedy all the cases where two defective lines occur in the RWD lines 43 and two defective lines occur in the DQ lines 45. In addition, since the RWD lines 43 and DQ lines 45 are independently remedied for defective lines, remedy solutions can be easily derived.

The intermediate connection lines 47 are preferably shorter. For example, each of the intermediate connection lines 47 may be formed as a terminal common to the shift switch blocks 32 and 36.

(Fourth Embodiment)

Figure 9:
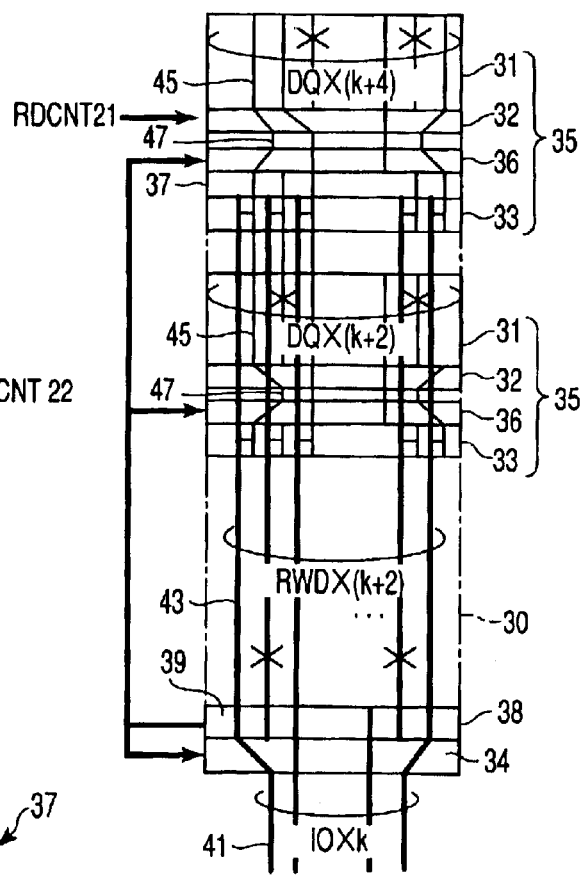
FIG. 9 is a view schematically showing a hybrid DRAM according to a fourth embodiment of the present invention.

FIG. 9 is a view schematically showing a hybrid DRAM according to a fourth embodiment of the present invention. The DRAM shown in FIG. 7 may be provided with a structure that tests the RWD lines 43 for defects, to replace them when the DRAM is turned on, so that a redundancy function with a high remedy efficiency can be realized. In this case, the remedy solution derivation requires only a conventional method to be used as it is, for the memory cell array block 31. The DRAM shown in FIG. 9 is constituted on the basis of this aspect.

As shown in FIG. 9, a (k: k is a natural number)-number of data input/output lines (IO lines) 41 are connected to the array region 30 of the DRAM. In the array region 30, a (k+2 or k+m: m=2)-number of common internal data lines (RWD lines) 43 are disposed in common to a plurality of memory cell array blocks 31. In each of the plurality of memory cell array blocks 31, a (k+2 or k+n: n=2)-number of individual internal data lines (DQ lines) 45 are disposed. Furthermore, in each of the plurality of memory cell array blocks 31, a k-number of individual inner RWD lines (intermediate connection lines) 47 are disposed between the RWD lines 43 and DQ lines 45.

Of the (k+2)-number of the RWD lines 43, a k-number of RWD lines 43 are connected to the k-number of IO lines 41 through a shift switch block (first common line connection circuit) 34 disposed in common to the plurality of memory cell array blocks 31. The k-number of RWD lines 43 are also connected to the k-number of intermediate connection lines 47 through a connection block 33 and shift switch block (second common line connection circuit) 36, which are disposed in each of the plurality of memory cell array blocks 31. On the other hand, of the (k+2)-number of DQ lines 45, a k-number of DQ lines 45 are connected to the k-number of intermediate connection lines 47 through a shift switch block (individual line connection circuit) 32 disposed in each of the plurality of memory cell array blocks 31. In the memory cell array block 31, portions corresponding to two DQ lines on the right side are used as spare portions for redundancy, as indicated with a reference symbol 31t.

An initial test determination block (test determination circuit) 38 and initial test vector generation block (test signal generation circuit) 37 are disposed one on either side of structural opposite ends of the (k+2)-number of common RWD lines 43, i.e., the connection end to the IO lines 41 and the connection end to the array block 31 farthest from the IO lines 41. More specifically, the initial test vector generation block 37 is disposed between the connection block 33 and shift switch block 36 in the block unit 35 farthest from the IO lines 41. The initial test determination block 38 is disposed between the shift switch block 34 and RWD lines 43.

The initial test vector generation block 37 is used to generate test patterns for examining the RWD lines 43 when the DRAM is turned on. For example, the test patterns are preset to test the RWD lines 43 two times, such that [10101010 . . . ] is first generated and [010101 . . . ] is second generated, in accordance with the order of the interconnection line array.

On the other hand, the initial test determination block 38 is used to compare the patterns thus generated and determine whether the RWD lines 43 are good or bad. If a received pattern is the same as the pattern described above at an interconnection line, this line is in a good state. At this time, "0" is inputted into a result holding resistor 39. If a received pattern is different from the pattern described above at an interconnection line, this line is in a defective state. At this time, "1" is inputted into a result holding resistor 39.

The output of the result holding resistor 39 comes into effect after the test, and the shift switch blocks 34 and 36 operate to select a k-number of normal RWD lines 43, excluding defective RWD lines, on the basis of the output. As a consequence, the 10 lines 41 and intermediate connection lines (individual RWD lines) 47 are automatically connected to each other through a k-number of normal RWD lines 43, when the DRAM is turned on. The shift switch block 32 operates to select a k-number of normal DQ lines 45, excluding defective DQ lines, and connect them to the intermediate connection lines 47, in accordance with a signal RDCNT21 from information concerning defects in each array block 31, stored in an internal ROM.

Figure 10:
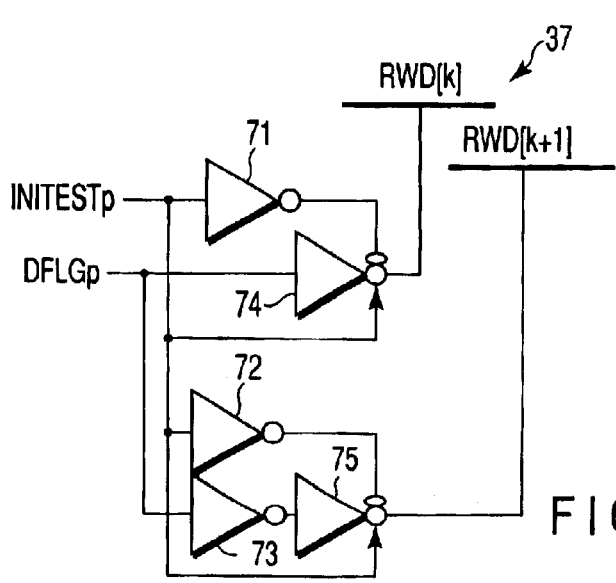
FIG. 10 is a circuit diagram showing a concrete example of an initial test vector generation block in the DRAM shown in FIG. 9.

FIG. 10 is a circuit diagram showing a concrete example of the initial test vector generation block 37. As shown in FIG. 10, this circuit includes inverters 71, 72, and 73 and clocked inverters 74 and 75. At the time other than the initial test, INITESTp is set at "L", whereby the outputs of the clocked inverters 74 and 75 are Hi-Z (high impedance state), thereby not disturbing the normal operation. At the initial test, INITESTp is set at "H", DFLGp and its inversion are respectively outputted to RWD[k+1] and RWD[k], which are RWD lines described above.

Figure 11:
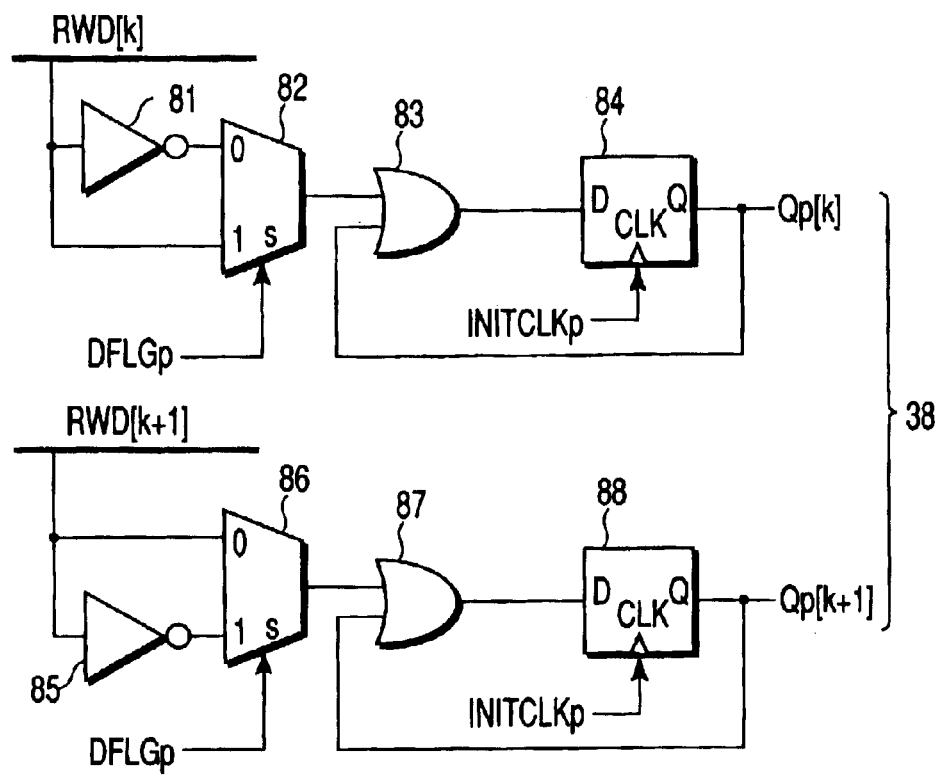
FIG. 11 is a circuit diagram showing a concrete example of an initial test determination block in the DRAM shown in FIG. 9.

FIG. 11 is a circuit diagram showing a concrete example of the initial test determination block 38. As shown in FIG. 11, this circuit includes inverters 81 and 85, multiplexers 82 and 86, NOR gates 83 and 87, and DFF circuit portions 84 and 88. Each of the multiplexers 82 and 86 outputs an input from an input terminal 1 when an s-input is set at "H", while it outputs an input from an input terminal 0 when the s-input is set at "L". Each of the DFF circuit portions 84 and 88 latches an input terminal D at the rising edge of a CLK input, and outputs it to an output terminal Q. The DFF circuit portions 84 and 88 correspond to the result holding resistor 39 shown in FIG. 9.

On the RWD[k] side, when DFLGp is set at "H", RWD[k] is inputted into the DFF circuit portion 84 as it is. When DFLGp is set at "L", RWD[k] is inverted and inputted into the DFF circuit portion 84. The NOR gate 83 is used to hold Qp[k] at "H" when it is turned into "H". Accordingly, the DFF circuit portion 84 has to be able to initialize Qp[k] into "L".

On the RWD[k+1] side, since the input is expected to be inverted relative to the RWD[k] side, the position of the inverters 85 differs from that of the inverters 81. However, operation manner on the RWD[k+1] side is basically the same as that on the RWD[k] side.

Figure 12:
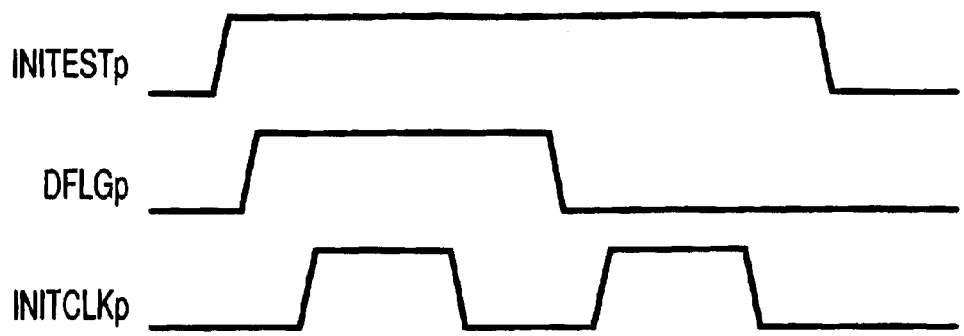
FIG. 12 is a view showing start-up waveforms of signals for controlling the circuits shown in FIGS. 10 and 11.

FIG. 12 is a view showing start-up waveforms of signals INITESTp, DFLGp, and INITCLKp for controlling the circuits shown in FIGS. 10 and 11. The circuits shown in FIGS. 10 and 11 are controlled by waveforms shown in FIG. 12, so that the DFF circuit portions (result holding resistor) 84 and 88 corresponding to defective RWD lines 43 hold "H". Then, the outputs come into effect, and the shift switch block 34 (see FIG. 9) performs a connection operation to avoid the defective RWD lines 43. In addition, this result is also transmitted to the shift switch block 36 in each block unit 35, and the shift switch block 36 performs the same connection operation.

According to the DRAM shown in FIG. 9, it is possible to automatically remedy defective RWD lines 43 in the start-up. In this case, the remedy solution derivation needs to be performed only for defective DQ lines 45 in each block unit 35. Accordingly, remedy solution derivation can be performed, using mere conventional methods.

In the first to fourth embodiments, the structures of the shift switch blocks 32, 34, and 36 may be changed to obtain a specific redundancy function. The features of the embodiments can be selectively used in accordance with required specifications.

According to the first to fourth embodiments of the present invention, it is possible to provide a semiconductor storage device, which has an improved redundancy structure compensating for defective data lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
   an array region including a plurality of memory cell array blocks, in each of which a plurality of memory cells are arrayed, the array region being connected to a (k: k is a natural number)-number of data input/output lines;
   a (k+m: m is a natural number)-number of common internal data lines provided in common to the plurality of memory cell array blocks;
   a (k+m+n: n is a natural number)-number of individual internal data lines provided to each of the plurality of memory cell array blocks;
   an individual line connection circuit for data line redundancy configured to respectively connect a (k+m)-number of the (k+m+n)-number of individual internal data lines to the (k+m)-number of common internal data lines, in accordance with a first defect information signal; and
   a common line connection circuit for data line redundancy configured to respectively connect a k-number of the (k+m)-number of common internal data lines to the k-number of data input/output lines, in accordance with a second defect information signal.

2. The device according to claim 1, wherein the individual internal data lines comprise a (k+m+n)-number of complementary line pairs, provided relative to the (k+m)-number of common internal data lines.

3. The device according to claim 2, further comprising a plurality of complementary bit line pairs connected to each of the memory cell array blocks, and sense amplifiers respectively connected to the complementary bit line pairs to read data in the memory cells, wherein the common internal data lines comprise line pairs, each of which has two lines respectively connected to two lines of each of the complementary bit line pairs.

4. The device according to claim 1, wherein the individual line connection circuit comprises shift switches each configured to switch from a defective line to a normal line, for connection of the individual internal data lines to the common internal data lines.

5. The device according to claim 1, wherein the common line connection circuit comprises shift switches each configured to switch from a defective line to a normal line, for connection of the common internal data lines to the data input/output lines.

6. A semiconductor storage device comprising:
   an array region including a plurality of memory cell array blocks, in each of which a plurality of memory cells are arrayed, the array region being connected to a (k: k is a natural number)-number of data input/output lines;
   a (k+m: m is a natural number)-number of common internal data lines provided in common to the plurality of memory cell array blocks;
   a (k+m)-number of individual internal data lines provided to each of the plurality of memory cell array blocks;
   an individual line connection circuit for data line redundancy configured to respectively connect a (k to k+m)-number of the (k+m)-number of individual internal data lines to a (k to k+m)-number of the (k+m)-number of common internal data lines, in accordance with a first defect information signal; and
   a common line connection circuit for data line redundancy configured to respectively connect a k-number of the (k to k+m)-number of common internal data lines to the k-number of data input/output lines, in accordance with a second defect information signal.

7. The device according to claim 6, wherein the individual internal data lines comprise a (k+m)-number of complementary line pairs, provided relative to the (k+m)-number of common internal data lines.

8. The device according to claim 7, further comprising a plurality of complementary bit line pairs connected to each of the memory cell array blocks, and sense amplifiers respectively connected to the complementary bit line pairs to read data in the memory cells, wherein the common internal data lines comprise line pairs, each of which has two lines respectively connected to two lines of each of the complementary bit line pairs.

9. The device according to claim 6, wherein the individual line connection circuit comprises shift switches each configured to switch from a defective line to a normal line, for connection of the individual internal data lines to the common internal data lines.

10. The device according to claim 6, wherein the common line connection circuit comprises shift switches each configured to switch from a defective line to a normal line, for connection of the common internal data lines to the data input/output lines.

11. A semiconductor storage device comprising:
    an array region including a plurality of memory cell array blocks, in each of which a plurality of memory cells are arrayed, the array region being connected to a (k: k is a natural number)-number of data input/output lines;
    a (k+m: m is a natural number)-number of common internal data lines provided in common to the plurality of memory cell array blocks;
    a (k+n: n is a natural number)-number of individual internal data lines provided to each of the plurality of memory cell array blocks;
    a k-number of intermediate connection lines provided between the common internal data lines and the individual internal data lines, to each of the plurality of memory cell array blocks;

an individual line connection circuit for data line redundancy configured to respectively connect a k-number of the (k+n)-number of individual internal data lines to the k-number of intermediate connection lines, in accordance with a first defect information signal;

a first common line connection circuit for data line redundancy configured to respectively connect a k-number of the (k+m)-number of common internal data lines to the k-number of data input/output lines, in accordance with a second defect information signal; and a second common line connection circuit for data line redundancy configured to respectively connect the k-number of common internal data lines to the k-number of intermediate connection lines, in accordance with the second defect information signal.

12. The device according to claim 11, further comprising a test signal generation circuit configured to generate a test signal for testing the common internal data lines, and a test determination circuit configured to determine whether the common internal data lines are good or bad, wherein the test signal generation circuit and the test determination circuit are respectively connected to opposite ends of the common internal data lines, and the test determination circuit includes a circuit portion configured to hold a test determination result and generate the second defect information signal based on the result.

13. The device according to claim 12, wherein the test signal generation circuit and the test determination circuit are preset to operate when the semiconductor storage device is turned on.

14. The device according to claim 11, wherein the intermediate connection lines are formed substantially of terminals common to the second common line connection circuit and the individual line connection circuit.

15. The device according to claim 11, wherein the individual internal data lines comprise a (k+n)-number of complementary line pairs, provided relative to the k-number of intermediate connection lines.

16. The device according to claim 15, further comprising a plurality of complementary bit line pairs connected to each of the memory cell array blocks, and sense amplifiers respectively connected to the complementary bit line pairs to read data in the memory cells, wherein the common internal data lines comprise line pairs, each of which has two lines respectively connected to two lines of each of the complementary bit line pairs.

17. The device according to claim 11, wherein the individual line connection circuit comprises shift switches each configured to switch from a defective line to a normal line, for connection of the individual internal data lines to the intermediate connection lines.

18. The device according to claim 11, wherein the first common line connection circuit comprises shift switches each configured to switch from a defective line to a normal line, for connection of the common internal data lines to the data input/output lines.

19. The device according to claim 11, wherein the second common line connection circuit comprises shift switches each configured to switch from a defective line to a normal line, for connection of the common internal data lines to the intermediate connection lines.

* * * * *